(12) United States Patent
Maayan et al.

(10) Patent No.: US 6,885,585 B2
(45) Date of Patent: Apr. 26, 2005

(54) NROM NOR ARRAY

(75) Inventors: Eduardo Maayan, Kfar Saba (IL); Boaz Eitan, Ra'Anana (IL)

(73) Assignee: Saifun Semiconductors Ltd., Netanya (IL)

( * ) Notice: Subject to any disclaimer, the term of this patent is extended or adjusted under 35 U.S.C. 154(b) by 344 days.

(21) Appl. No.: 10/023,469

(22) Filed: Dec. 20, 2001

(65) Prior Publication Data

US 2003/0117861 A1 Jun. 26, 2003

(51) Int. Cl.$^7$ ................................................ G11C 7/00
(52) U.S. Cl. ............... 365/185.17; 365/63; 365/185.05; 365/185.11; 365/94; 365/72
(58) Field of Search ....................... 365/185.17, 185.05, 365/185.11, 63, 94, 72

(56) References Cited

U.S. PATENT DOCUMENTS

| | | |
|---|---|---|
| 3,895,360 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,471,373 A | 9/1984 | Shimizu et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |

(Continued)

FOREIGN PATENT DOCUMENTS

| | | | |
|---|---|---|---|
| EP | 0693781 | 1/1996 | |
| EP | 0751560 | 1/1997 | |
| EP | 1073120 | 1/2001 | |
| GB | 2157489 | 10/1985 | |
| JP | 404226071 | 8/1992 | |
| JP | 04291962 | 10/1992 | |
| JP | 05021758 | 1/1993 | |
| JP | 07193151 | 7/1995 | |
| JP | 408106791 A | * 4/1996 | ........... G01C/16/06 |
| JP | 408297988 A | * 11/1996 | ........... G11C/16/06 |
| JP | 409017981 A | * 1/1997 | ......... H01L/27/115 |
| JP | 09162314 | 6/1997 | |
| JP | 411354758 A | * 12/1999 | ......... H01L/27/115 |
| JP | 02001085646 A | * 3/2001 | ......... G01L/27/115 |
| JP | 02001118392 A | * 4/2001 | ........... G11C/16/02 |
| JP | 02002216488 A | * 8/2002 | ........... G11C/16/06 |
| WO | WO 96/15553 | 5/1996 | |
| WO | WO 99/31670 | 6/1999 | |

OTHER PUBLICATIONS

U.S. Appl. No. 08/902,890, filed Jul. 30, 1997, Eitan.
U.S. Appl. No. 08/905,286, filed Jul. 30, 1997, Eitan.

(Continued)

*Primary Examiner*—Viet Q. Nguyen
(74) *Attorney, Agent, or Firm*—Eitan, Pearl, Latzer & Cohen Zedek, LLP

(57) ABSTRACT

A NOR array includes a first plurality of word lines, a second plurality of bit lines and a third plurality of common lines. Each word line connects to the gates of a row of nitride read only memory (NROM) cells. Each bit line connects to one diffusion area of each NROM cell in a column of the NROM cells and each common line connects to the other diffusion areas of each NROM cell in a row of the NROM cells.

14 Claims, 7 Drawing Sheets

U.S. PATENT DOCUMENTS

| | | |
|---|---|---|
| 4,742,491 A | 5/1988 | Liang et al. |
| 4,780,424 A | 10/1988 | Holler et al. |
| 4,847,808 A | 7/1989 | Kobatake |
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,075,245 A | 12/1991 | Woo et al. |
| 5,117,389 A | 5/1992 | Yiu |
| 5,168,334 A | 12/1992 | Mitchell et al. |
| 5,172,338 A | 12/1992 | Mehrotra et al. |
| 5,175,120 A | 12/1992 | Lee |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,305,262 A | 4/1994 | Yoneda |
| 5,311,049 A | 5/1994 | Tsuruta |
| 5,315,541 A | 5/1994 | Harari et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,375,094 A | 12/1994 | Naruke |
| 5,393,701 A | 2/1995 | Ko et al. |
| 5,394,355 A | 2/1995 | Uramoto et al. |
| 5,399,891 A | 3/1995 | Yiu et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,450,341 A | 9/1995 | Sawada et al. |
| 5,450,354 A | 9/1995 | Sawada et al. |
| 5,467,308 A | 11/1995 | Chang et al. |
| 5,477,499 A | 12/1995 | Van Buskirk et al. |
| 5,495,440 A | 2/1996 | Asakura |
| 5,521,870 A | 5/1996 | Ishikawa |
| 5,523,251 A | 6/1996 | Hong |
| 5,553,018 A | 9/1996 | Wang et al. |
| 5,583,808 A | 12/1996 | Brahmbhatt |
| 5,599,727 A | 2/1997 | Hakozaki et al. |
| 5,623,438 A | 4/1997 | Guritz et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,712,814 A | 1/1998 | Fratin et al. |
| 5,726,946 A | 3/1998 | Yamagata et al. |
| 5,751,037 A | 5/1998 | Aozasa et al. |
| 5,754,475 A | 5/1998 | Bill et al. |
| 5,768,192 A | 6/1998 | Eitan |
| 5,777,919 A | 7/1998 | Chi-Yung et al. |
| 5,787,036 A | 7/1998 | Okazawa |
| 5,793,079 A | 8/1998 | Georgescu et al. |
| 5,825,686 A | 10/1998 | Schmitt-Landsiedel et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,946,558 A | 8/1999 | Hsu |
| 5,949,728 A | 9/1999 | Liu et al. |
| 5,963,412 A | 10/1999 | En |
| 5,963,465 A | 10/1999 | Eitan |
| 5,973,373 A | 10/1999 | Krautschneider et al. |
| 5,990,526 A | 11/1999 | Bez et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,063,666 A | 5/2000 | Chang et al. |
| 6,081,456 A | 6/2000 | Dadashev |
| 6,128,226 A | 10/2000 | Eitan et al. |
| 6,134,156 A | 10/2000 | Eitan |
| 6,137,718 A | 10/2000 | Reisinger |
| 6,163,048 A | 12/2000 | Hirose et al. |
| 6,201,282 B1 | 3/2001 | Eitan |
| 6,429,063 B1 * | 8/2002 | Eitan .......................... 438/232 |
| 6,704,217 B1 * | 3/2004 | Eitan .......................... 365/63 |
| 6,728,134 B1 * | 4/2004 | Ooishi .................. 365/185.03 |
| 6,743,677 B1 * | 6/2004 | Randolph et al. ........... 438/257 |

OTHER PUBLICATIONS

U.S. Appl. No. 09/211,981, filed Dec. 14, 1998, Eitan.
U.S. Appl. No. 09/348,720, filed Jul. 6, 1999, Eitan.
U.S. Appl. No. 09/413,408, filed Oct. 6, 1999, Eitan.
U.S. Appl. No. 09/536,125, filed Mar. 28, 2000, Eitan et al.
U.S. Appl. No. 09/761,818, filed Jan. 18, 2001, Eliyahu et al.
Ricco, Bruno et al., "Nonvolatile Multilevel Memories for Digital Applications," *IEEE*, vol. 86, No. 12, pp. 2399–2421, Dec., 1998.
"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, pp. 136–140, Sep., 1992.
Tseng, Hsing–Huang et al., "Thin CVD Stacked Gate Dielectric for ULSI Technology", *IEEE*, 0–7803–1450–6, pp. 321–324, 1993.
Pickar, K.A., "Ion Implantation in Silicon," *Applied Solid State Science*, vol. 5, R. Wolfe Edition, Academic Press, New York, pp. 151–249, 1975.
Bhattacharyya et al., "FET Gate Structure for Nonvolatile N–Channel Read–Mostly Memory Device," *IBM Technical Disclosure Bulletin*, U.S. IBM Corp. vol. 18, No. 6, p. 1768, Nov., 1975.
Bude et al., "EEPROM/Flash Sub 3.0 V Drain–Source Bias Hot carrier Writing", *IEDM* 95, pp. 989–992.
Bude et al., "Secondary Electron Flash—a High Performance, Low Power Flash Technology for 0.35 um and Below", *IEDM*97, pp. 279–282.
Bude et al., "Modeling Nonequilibrium Hot Carrier Device Effects", *Conference of Insulator Specialists of Europe*, Sweden, Jun., 1997.

* cited by examiner

US 6,885,585 B2

NROM NOR ARRAY

FIELD OF THE INVENTION

The present invention relates generally to NOR array architectures for memory arrays and specifically, to such arrays for non-volatile memories such as nitride read only memory (NROM) arrays.

BACKGROUND OF THE INVENTION

A memory cell typically is formed of a channel between two terminals, known as the source and drain. Above, the channel is some form of memory element, which is activated by a third terminal, known as the gate.

To create an array of memory cells, the gates of rows of cells are connected together in word lines, the drains of columns of cells are connected together as bit lines and the sources are connected together as either bit lines or common sources. The arrangement of word lines, bit lines and common lines or common sources is known as the architecture of the array and there are many such architectures.

Our common architecture is called the "NOR array". Such an architecture is shown in FIG. 1, to which reference is now made.

FIG. 1 shows an array of cells 10 whose gates G are connected in rows by word lines WLi and whose drain D are connected in columns by bit lines BLj. The sources S of the cells are connected to ground lines, indicated by arrowheads. FIG. 1 indicates that the word lines WLi are connected to a row decoder (XDEC) 12 and the bit lines BLj are usually accessed by a multiplier (YMUX) 16 through which the cells can be biased and read. The NOR architecture of FIG. 1 is useful for read only memory (ROM) arrays and FLASH electrically erasable, programmable read only memory (EEPROM) arrays and is very common for floating gate type cells. Non-FLASH EEPROM arrays (i.e. arrays wherein each cell or a small subset of cells is individually erasable) require a modified NOR array, as shown in FIG. 2, to which reference is now made.

In this architecture, each cell 10 is controlled by a select cell 18 and a row of select cells 18 is controlled by a select line SELi. Select cells 18 are typically standard transistors (such as n-channel MOS transistors) whose drains are connected to the bit lines BLj, whose sources are connected to the drain of the cells 10 that they control and whose gates are connected to the relevant select line SELi. When a cell, such as cell 10A, is to be accessed, its word line WLi and associated select line SELi are activated as is its bit line BLj. Because select line SELi and word line WLi are activated, the cells of the *ith* row are potentially activated. However, the only cell that will be accessed is cell 10A since only its drain will receive power, through activated select transistor 18A. Other cells that share the accessed word line WLi and select line SELi do not feel any high voltage because their bit lines are not activated. Furthermore, cells sharing the same bit line BLj do not feel the high bit line voltage because their select transistors SELi are off.

In addition to the "per-cell select transistor", there are typically "array select transistors", which segment the array into blocks. The need for so many cell select transistors significantly increases the cell area.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention is a NOR array having nitride read only memory (NROM) type cells. NROM cells are described in U.S. Pat. Nos. 5,768,192 and 6,011,725 and in copending U.S. Pat. No. 6,552,387 all assigned to the common assignees of the present invention. The disclosures of the above-identified patents and application are incorporated herein by reference.

An NROM cell will be briefly described with respect to FIGS. 3A and 3B, after which a plurality of NOR array architectures and their operations will be described.

Figure 3A:
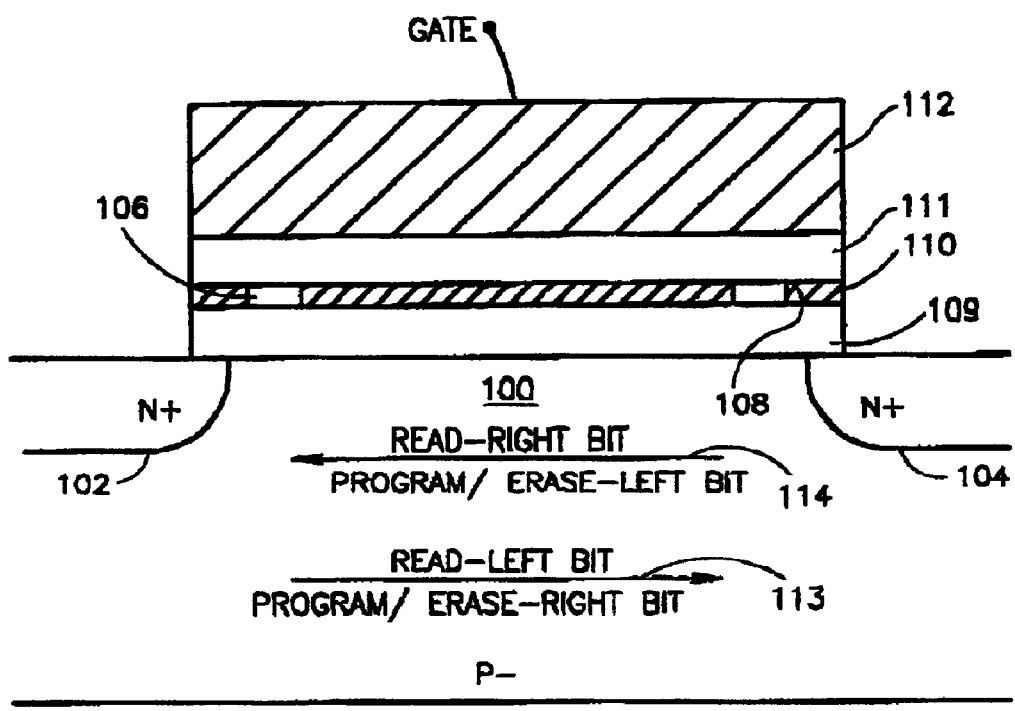
FIGS. 3A and 3B are schematic illustrations of an NROM memory cell.
Figure 3B:
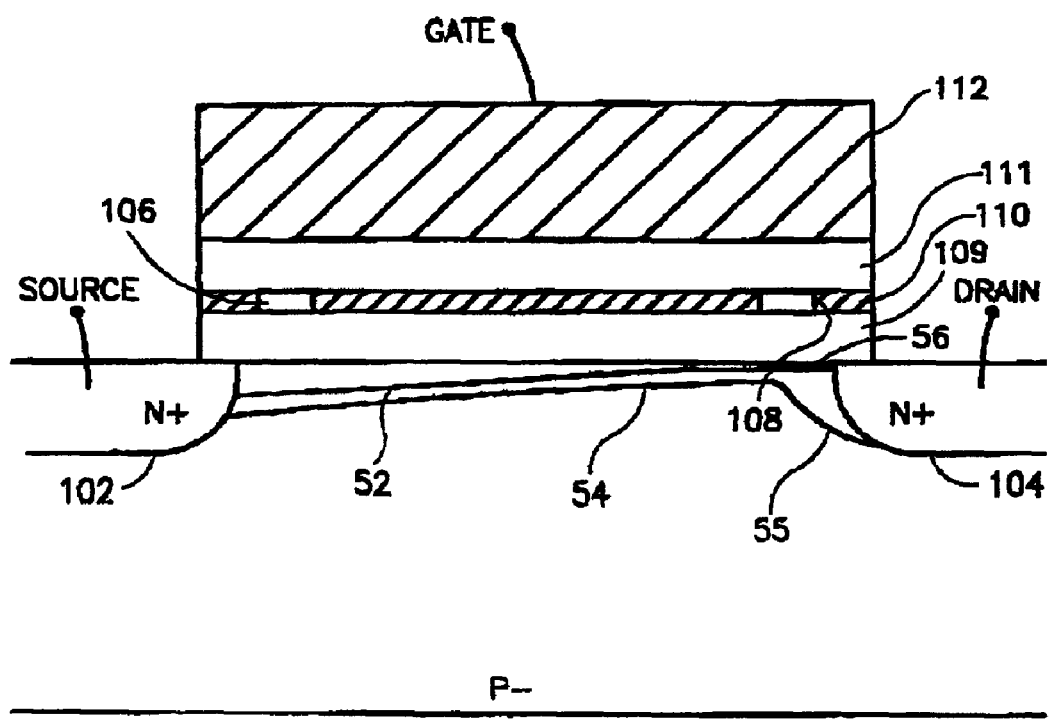

Reference is now made to FIGS. 3A and 3B, which illustrate the NROM cell and its operation. The NROM cell has channel 100 between two diffusion areas 102 and 104. However, unlike floating gate cells, the NROM cell has two separated and separately chargeable areas 106 and 108 found within a nitride layer 110 formed in an oxide-nitride-oxide (ONO) sandwich (layers 109, 110 and 111) underneath gate 112. Each chargeable area defines one bit. The NROM cell can be utilized either as a single bit cell (using only one of areas 106 and 108) or a dual bit cell (using both) and each of the bits 106 and 108 can be operated as a multi level bit.

To program the left bit in area 106, the left diffusion area 102 receives a high programming voltage $V_D$ (i.e. area 102 is the drain) and right diffusion area 104 is grounded (i.e. area 104 is the source). Hence the electrons flow from area 104 to area 102. This is indicated by arrow 114. The channel hot electrons are then injected into the nitride layer, in area 106. The negative charge in area 106 raises the threshold voltage of the cell, if read in the reverse direction.

The opposite is true for programming area 108; the left diffusion area 102 is the source (i.e. grounded) and right diffusion area 104 is the drain (i.e. receives high programming voltage $V_D$). The cell is therefore programmed in the opposite direction, as indicated by arrow 113, and the electrons then jump up into chargeable area 108.

To erase the left bit in area 106, the gate receives a negative erase gate voltage Vge, the left diffusion area 102 receives an erase voltage $V_e$ and right diffusion area 104 is left floating. To erase the right bit in area 104, the gate receives a negative erase gate voltage Vge, the right diffusion area 104 receives the erase voltage $V_e$ and left diffusion area 102 is left floating.

For NROM cells, each bit is read in the direction opposite (a "reverse read") to that of its programming direction. An explanation of the reverse read process is described in U.S.

patent application Ser. No. 08/905,286, mentioned above. To read the left bit stored in area 106, right diffusion area 104 acts as the drain and left diffusion area 102 acts as the source. This is known as the "read through" direction, indicated by arrow 113. To read the right bit stored to area 108, the cell is read in the opposite direction, indicated by arrow 114. Thus, left diffusion area 102 is the drain and right diffusion area 104 is the source.

During the read operation, the presence of the gate and drain voltages $V_G$ and $V_D$, respectively, induce a depletion layer 54 (FIG. 3B) and an inversion layer 52 in the center of channel 100 (shown in FIG. 3A). The drain voltage $V_D$ is large enough to induce a depletion region 55 near drain 104 that extends to the depletion layer 54 of channel 100. This is known as "barrier lowering " and it causes "punch-through" of electrons from the inversion layer 52 to the drain 104.

Since area 106 is near left diffusion area 102 which, for this case, acts as the source (i.e. low voltage level), the charge state of area 106 will determine whether or not the inversion layer 52 is extended to the source 102. If enough electrons are trapped in left area 106, then the voltage thereacross will not be sufficient to extend inversion layer 52 to the source 102, the cells current will be low, and a "0" will be read. The opposite is true if area 106 has no charge.

Figure 4A:
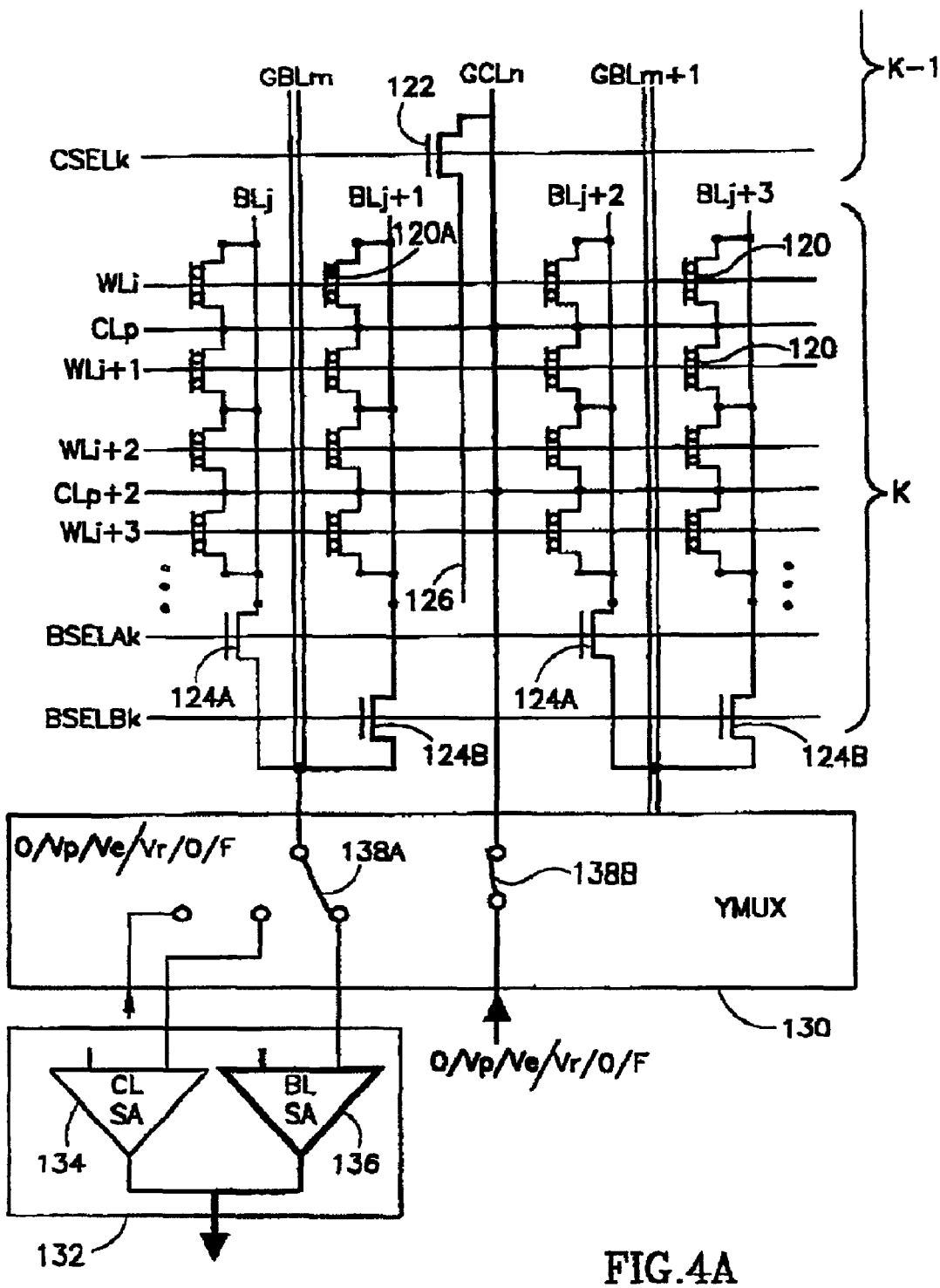
FIGS. 4A and 4B are illustrations of a NOR array for two bit NROM cells, operating as FLASH EEPROMs, constructed and operative in accordance with an embodiment of the present invention.
Figure 4B:
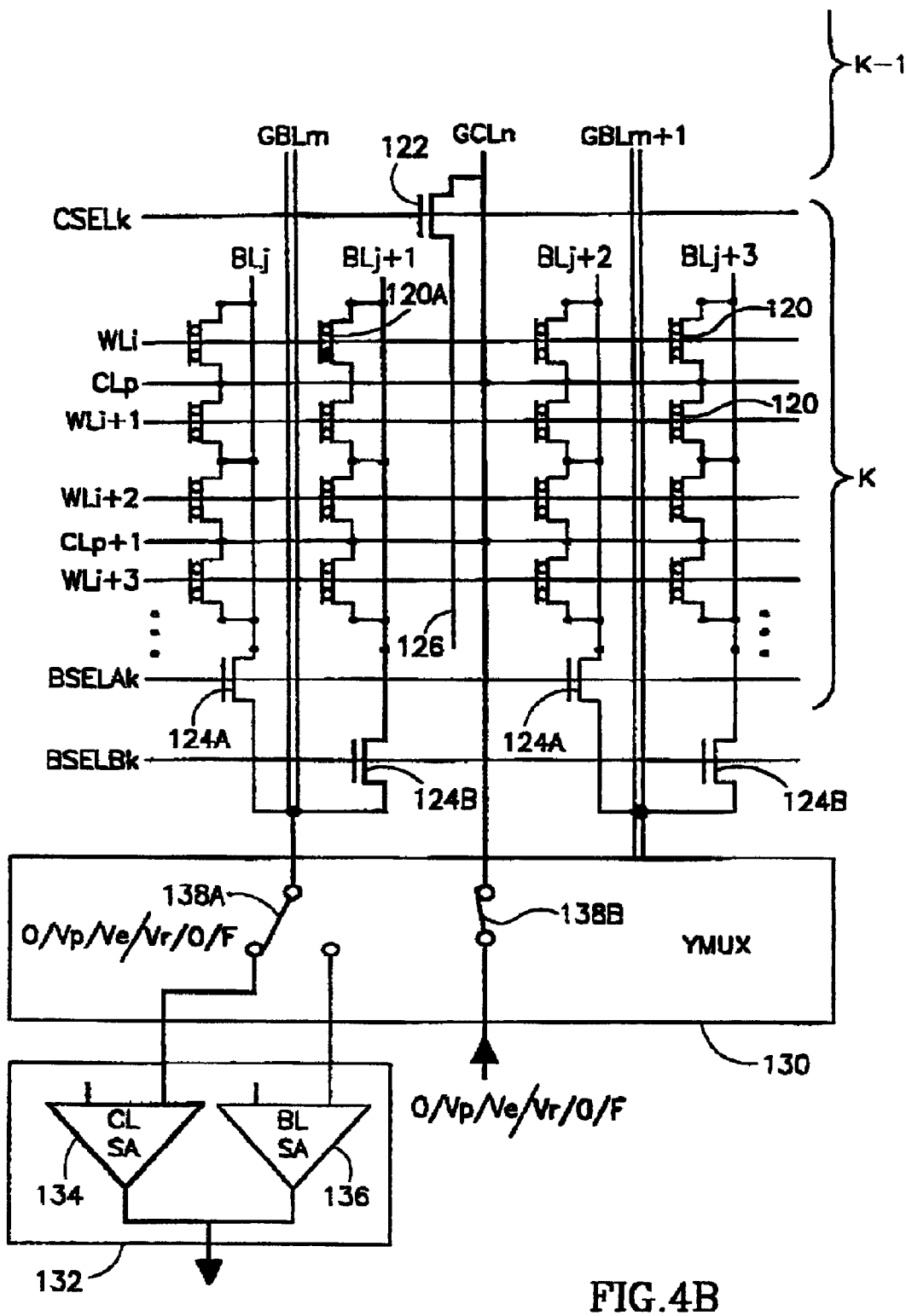

Reference is now made to FIGS. 4A and 4B, which illustrate a NOR array for NROM cells, labeled 120, operating as FLASH EEPROMs. As in a standard NOR array, word lines WLi connect the gates of a row of NROM cells 120. Bit lines BLj are connected to one of the diffusion areas of a column of NROM cells 120 while common lines CLp are connected to the other diffusion area of a row of NROM cells 120. It is noted that, in this embodiment, pairs of neighboring NROM cells of a column can share the same common line CLp. Similarly, pairs of neighboring NROM cells of a column can share the same connection to the BLj. Thus, there is one common line CLp for every two word lines WLi and WLi+1 and one common connection to the BLj for every pair of NROM cells on every two word lines WLi+1 and WLi+2. However, the specific arrangement of shared common lines and shared BL connections shown herein is only an exemplary arrangement.

As shown in the exemplary embodiment of FIGS. 4A and 4B, the array is segmented and a block k of word lines is accessed through a single common select transistor 122 and a plurality of bit line select transistors 124A and 124B. It will be appreciated that the segmentation is not required to practice the present invention, nor is the particular segmentation shown in FIGS. 4A and 4B the only segmentation possible. Exemplary segmentations for a different architecture are described in U.S. Pat. No. 6,633,496, filed Dec. 4, 2000, whose disclosure is incorporated herein. Such segmentation, which includes multiple levels of select lines, can be utilized herein as well.

Common select transistors 122 are controlled by common select lines CSELk while bit line select transistors 124A and 124B are controlled by bit line select lines BSELAk and BSELBk, respectively. The common select transistor 122 of a block connects a local common line CLp, local to the block k, to a global common line GCLn that extends to a column of blocks. For this purpose, there is a connecting line 126 that connects common select transistors 122 to the common lines of the block.

There is one bit line select transistor 124 for each local bit line BLj, local to the block k. For every pair of local bit lines BLj, there is a global bit line GBLm to which they are connected via bit line select transistors 124A and 124B. Which local bit line BLj is currently connected to global bit line GBLm depends on which select line BSELAk or BSELBk is currently activated.

The array additionally comprises control elements which activate and provide power to the various selected word, bit, select and common lines. Two elements, in particular, are shown in FIGS. 4A and 4B, a Y multiplexer (YMUX) 130 and a sensing unit 132.

In the present invention, sensing is performed on the selected bit line. However, since there are two storage areas in each NROM cell 120 and since the storage areas are read in opposite directions, sensing unit 132 has two sense amplifiers, a CL sense amplifier 134 and a BL sense amplifier 136. YMUX 130 connects the selected bit line to the relevant sense amplifier 134 or 136, depending on the type of storage area being read.

To access the block k, common select line CSELk activates common select transistor 122 to connect global common line GCLn to the common lines CLp of block k. To access the highlighted cell 120A, power must be provided to word line WLi and to local bit line BLj+1. To provide power to local bit line BLj+1, bit line select line BSELBk must activate bit line select transistor 124B to connect global bit line GBLm to local bit line BLj+1. Moreover, YMUX 130 is configured to provide power to global bit line GBLm and to global common line GCLn via switches 138. Switch 138A connects to the relevant bit line power supply for pre-charge of the selected bit line, after which switch 138A connects to the relevant sense amplifier for sensing. Switch 138B connects global common line GCLn to its relevant power supply during sensing.

In FIGS. 4A and 4B, the path that the current follows is bolded. It flows from a power source (not shown) through YMUX 130 to global common line GCLn, through common select transistor 122 to connecting line 126 to common line CLp to one diffusion area of NROM cell 120A. The current then flows through NROM cell 120A to the other diffusion area which is connected to local bit line BLj+1, through bit line select transistor 124B to global bit line GBLm and through YMUX 130 to one of the sense amplifiers of sensing unit 132.

For the present discussion, the storage area on the bit line side will be called herein the "BL storage area" and the storage area on the common line side will be called herein the "CL storage area". FIG. 4A illustrates the operations for the BL storage area (marked as a dark circle on NROM cell 120A) while FIG. 4B illustrates the operation for the CL storage area. It is noted that the voltage levels to be provided to the global bit and common lines during the read/program/erase operations are listed on the figures in that order, first for the BL storage area followed by those for the CL storage area. Thus, the label Vr/0/F indicates that the line receives a read voltage Vr during reading, a 0 (or ground) voltage during programming and is left floating (F), or driven to a low voltage, during erasure. The voltages used for accessing the relevant type of cell are bolded.

In reading, the terminal close to the storage area being read is grounded. Thus, for the BL storage area, bit line BLj+1 is grounded and YMUX 130 is configured to connect the global bit line GBLm to BL sense amplifier 136 for close to ground reading. In addition, global bit line GBLm is discharged to ground (thereby to bring bit line BLj+1 to ground). The global common line is driven to the read voltage Vr (such as 1.5V) and the word line WLi is driven to its voltage for reading, such as 3.5V. To sense the threshold voltage of the BL storage area, global bit line GBLm is released and the signal (current or voltage—either of the two is possible) is allowed to develop from the ground level. More details about implementing close to ground reading can be found in U.S. Pat. No. 6,128,226, whose disclosure is incorporated herein by reference.

During programming, the terminal close to the storage area being programmed is at a programming level Vp. Thus, for the BL storage area, global bit line GBLm is driven to the programming level Vp, such as 4–6V, and global common line GCLn is grounded. Word line WLi is driven to its programming level, such as 9V, YMUX 130 is configured to disconnect BL sense amplifier 136. Alternatively, the bit line select transistors BSELAk or BSELBk can be used to disconnect.

For FLASH EEPROMs, the cells of a block are erased together. In the present invention, the BL storage areas are erased together. To do so, the global common line GCLn for the block is set to float or driven to a low voltage (such as 1.5V), all of the global bit lines GBL for the block are driven to the erase voltage Ve (such as 4V) and the word lines WL of the block are driven to their erase voltage, such as −7V. Once again, YMUX 130 or bit line select transistors BSELA/Bk are configured to disconnect BL storage area sense amplifier 136.

Generally, the opposite set of operations occurs in order to access CL storage area. As can be seen in FIG. 4B, the connections are the same, but the voltages provided to the global common and bit lines are opposite. Thus, if for the BL storage area the global bit line GBLm received 0/Vp/Ve and the common line GCLn received Vr/0F, then for the CL storage area, the global bit line GBLm receives Vr/0/F and the common line GCLn receives 0/Vp/Ve.

Furthermore, in order to read the CL storage area, YMUX 130 is configured to connect global bit line GBLm to CL sense amplifier 134. For the latter, the following is noted: global bit line GBLm is first precharged to a positive read voltage Vr (about 1.5V) after which, the precharge is released and a signal develops at CL sense amplifier 134 which is close to the precharge levels. This is in contrast to method for reading the BL storage area, for which a close to ground sensing operation is utilized. As CL sense amplifier 134 is a standard type of sense amplifier (which senses the current or voltage, as desired, which develops after the precharge is released), it will not be further described.

Finally, all of the CL storage areas of a block are erased together. To do so, the global common lines GCL of the block are driven to the erase voltage Ve, all of the global bit lines GBL of the block are set to float and the word lines WL of the block are driven to their erase voltage. For example, a −7V erase voltage can be used. Positive erase voltages can be utilized as well.

Figure 2:
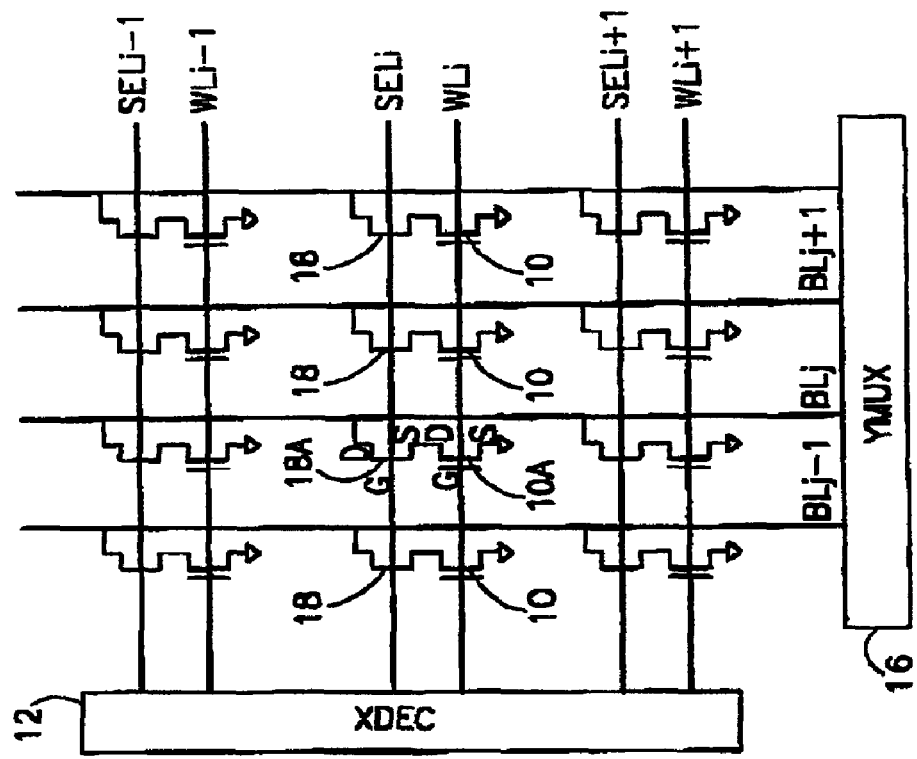
FIG. 2 is an illustration of a NOR array for EEPROM cells.
Figure 1:
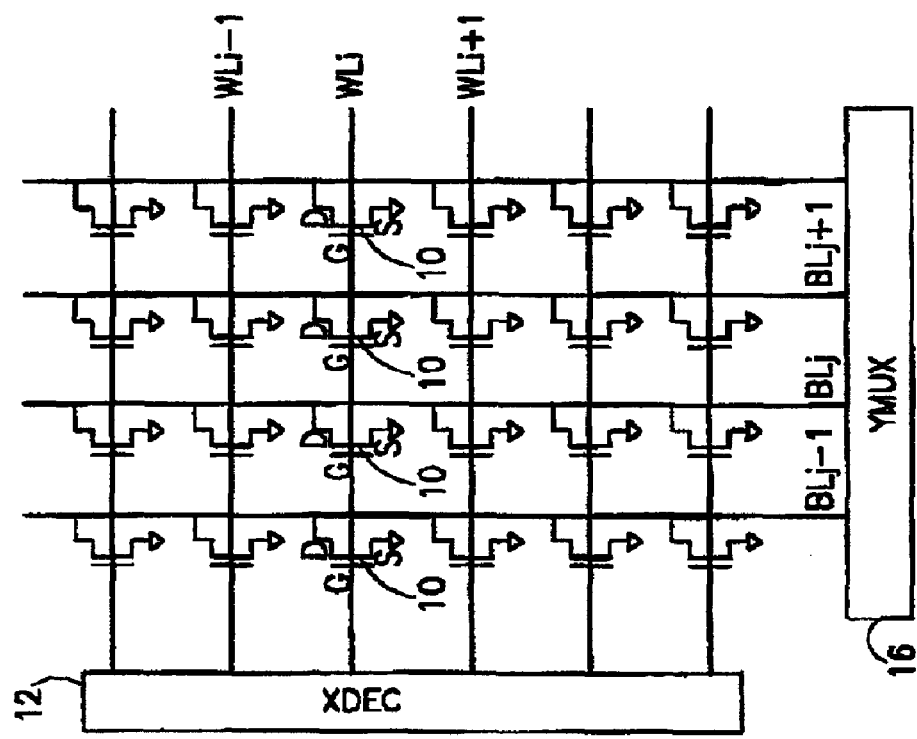
FIG. 1 is an illustration of a NOR array.
Figure 5:
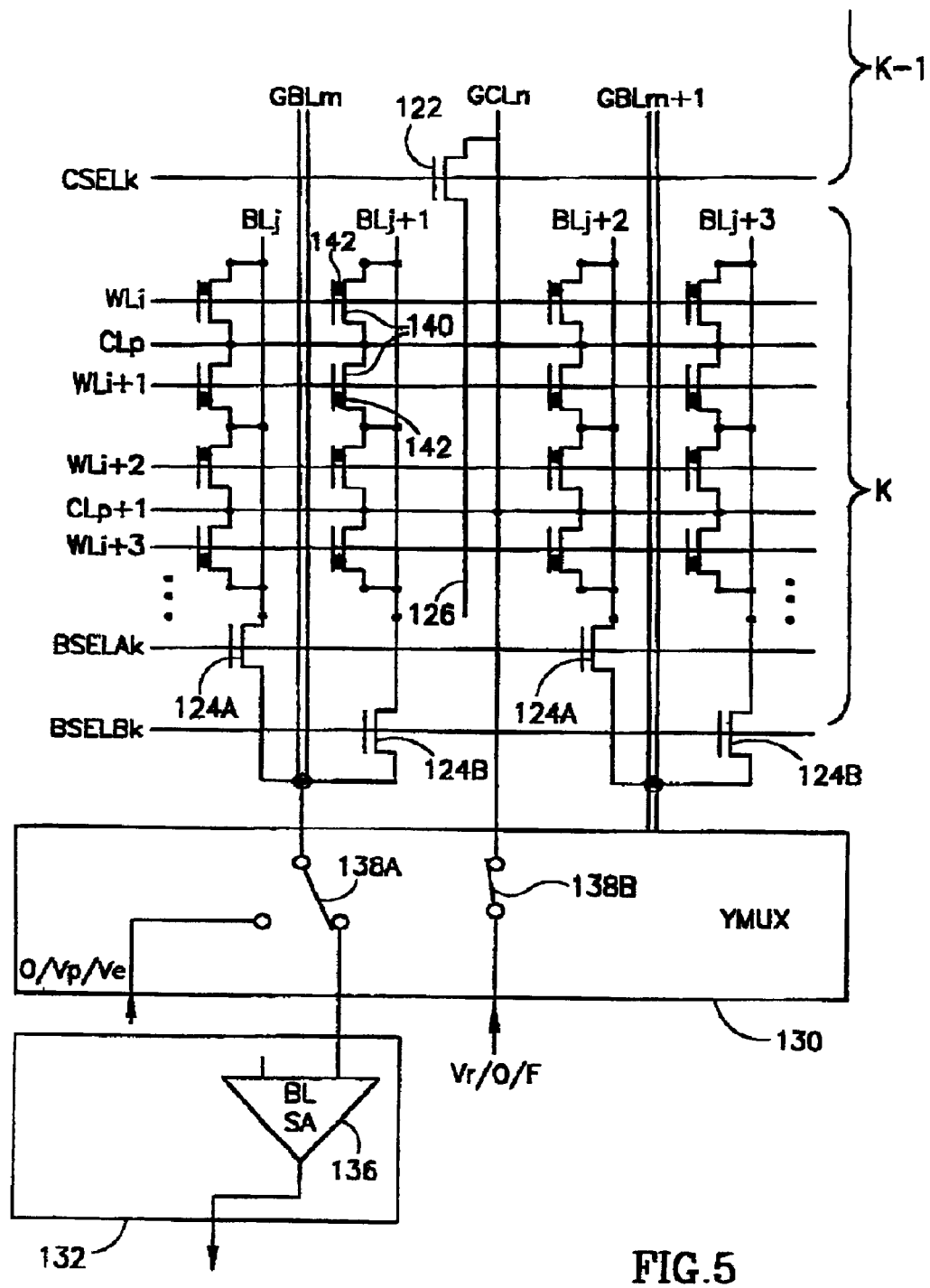
FIG. 5 is an illustration of a single bit per cell, EEPROM array within a NOR array, constructed and operative in accordance with a further embodiment of the present invention.

Reference is now made to FIG. 5, which illustrates the architecture of the present invention for a single storage area per cell EEPROM array. This embodiment utilizes a similar architecture and thus, similar elements carry similar reference numerals. The architecture will not be further described except to note that it has no select SEL transistors such as are found in the EEPROM array of FIG. 2.

In this embodiment, each NROM cell, labeled 140, stores a single, individually programmable and individually erasable EEPROM storage area 142. For each cell, the EEPROM storage area is a BL storage area, located on the bit line side of the cell. It is noted that the CL storage areas cannot be individually erased because, during erasure of a CL storage area, its common line CLp is at a high level, its word line is negative and its bit line floats. Since the common lines are parallel to the word lines, this means that each CL storage area of a row receives the same sets of voltages (negative word line, high common line and floating bit line) and thus, the entire row of CL storage areas corresponding to the accessed word line WL are erased together.

The EEPROM storage area is programmed and read as described hereinabove for the BL storage area. Thus, to program the EEPROM bit, the programming voltage Vp is provided to the relevant local bit line BLj and the relevant common line is grounded. Reading is done from a close to ground voltage and thus, the global bit line GCLm is connected to source amplifier 136 and the global common line is driven to read voltage Vr. As previously mentioned, the close to ground readout can be performed as a current or voltage readout. No CL sense amplifier is needed in this embodiment.

For erasure of an individual storage area, erase voltage Ve is provided to the relevant local bit line BLj while the remaining local bit lines are set to float. All of the common lines are set to float. A negative voltage is provided only to the relevant word line WLi; the remaining word lines WLi are set either to 0V or to a positive inhibit voltage. A suitable inhibit voltage is discussed in assignee's copending application Ser. No. 09/761,818, filed Jan. 18, 2001 and entitled "An EEPROM Array And Method For Operation Thereof", which disclosure is incorporated herein by reference.

It will be appreciated that, when the previously described erase voltages are provided, only the BL storage area of the NROM cell at the intersection of selected bit line BLj and selected word line WLi will be erased since this is the only cell to receive such an erase set of voltages; no other cells receive a similar set of voltages. All the other cells in the same row receive the same negative voltage on their word lines but their local bit lines are floating and thus, these cells do not erase. All the other cells in the same column receive the same erase voltage Ve on their bit lines but their word lines are at a positive voltage level, so they do not erase either.

Figure 6:
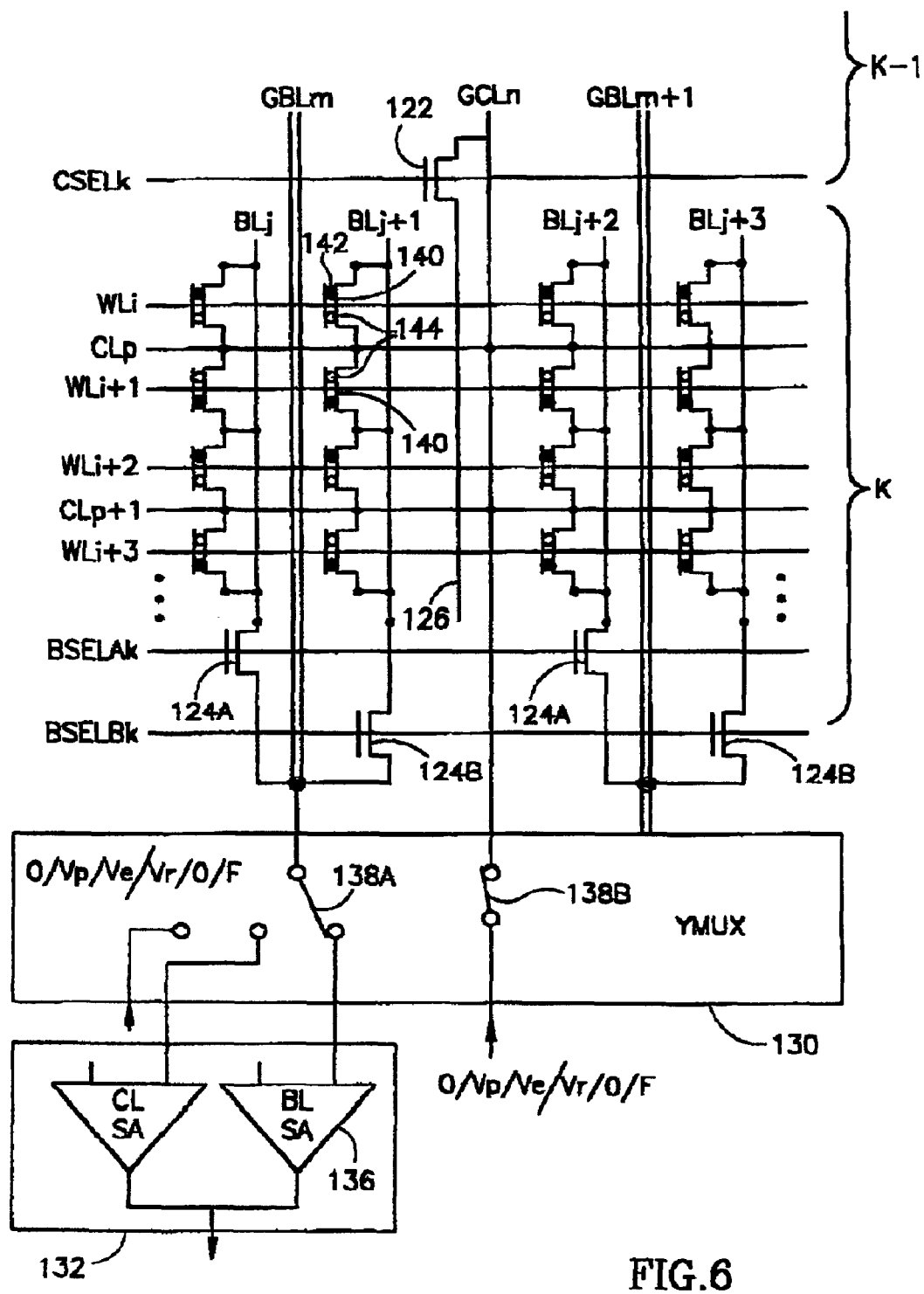
FIG. 6 is an illustration of a combined FLASH and EEPROM array in a NOR architecture, constructed and operative in accordance with another embodiment of the present invention.

Reference is now made to FIG. 6, which illustrates a combined FLASH and EEPROM array in a NOR architecture, constructed and operative in accordance with a further embodiment of the present invention. In this embodiment, each NROM cell 140 has two storage areas. The BL storage area 142 is an EEPROM storage area, as described hereinabove with respect to FIG. 5, while the CL storage area, labeled 144, is a FLASH storage area. In other words, a group of the CL storage areas 144 (such as those connected to a common line or all of the storage areas of a block) may be erased together while the EEPROM BL storage areas 142 may be individually erasable.

The operation for BL storage areas 142 has been described hereinabove with respect to FIG. 5 and thus, will not be further described. For the FLASH CL storage areas 144, the operation is as described hereinabove with respect to FIG. 4B. CL sense amplifier 134 is utilized during a read operation and, as these are FLASH bits, all of the CL storage areas of a block are erased together.

It is noted that, since these are NROM cells, the two storage areas are separately accessible and any operation designed to access a BL storage area will not affect its neighboring CL storage area.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described hereinabove. Rather the scope of the invention is defined by the claims that follow.

What is claimed is:

1. A NOR array comprising:
    a first plurality of word lines, each word line connecting to the gates of a row of nitride read only memory (NROM) cells;
    a second plurality of bit lines, each bit line connecting to one diffusion area of each NROM cell in a column of said NROM cells; and
    a third plurality of common lines, each common line connecting to the other diffusion areas of each NROM cell in a row of said NROM cells.

2. An array according to claim 1 wherein each said NROM cell has a common line storage area and a bit line storage area.

3. An array according to claim 2 wherein said bit line storage area stores at least one electrically erasable programmable read only memory (EEPROM) bit and said common line storage area stores at least one FLASH EEPROM bit.

4. An array according to claim 2 wherein said common line and bit line storage areas store FLASH EEPROM bits.

5. An array according to claim 4 and wherein the bits stored in the bit line storage areas of cells on a bit line are erasable together.

6. An array according to claim 4 and wherein the bits stored in the common line storage areas of cells of a common line are erasable together.

7. An array according to claim 2 and also comprising a sensing unit having a CL sense amplifier and a BL sense amplifier.

8. An array according to claim 7 and wherein said BL sense amplifier is a close to ground sense amplifier.

9. An array according to claim 7 and wherein said CL sense amplifier is a non-close to ground sense amplifier.

10. An array according to claim 7 wherein each said common line storage area is on a common line side of said cell which is connectable to said CL sense amplifier and each said bit line storage area is on a bit line side of said cell which is connectable to said BL sense amplifier.

11. An array according to claim 1 wherein each said NROM cell has at least one EEPROM storage area.

12. An array according to claim 11 and wherein said at least one EEPROM storage area is a bit line storage area and the EEPROM bits stored in the bit line storage areas of cells sharing the same bit line can be individually erased.

13. An array according to claim 11 and wherein said at least one EEPROM storage area is a bit line storage area and wherein a subset of the EEPROM bits stored in the bit line storage areas of cells sharing the same bit line can be erased together.

14. An array according to claim 11 wherein each said EEPROM storage area is on a bit line side of said cell and wherein said bit line side is connectable to a close to ground sense amplifier.

* * * * *